(12) United States Patent
Xu et al.

(10) Patent No.: US 8,206,893 B2
(45) Date of Patent: Jun. 26, 2012

(54) PHOTOIMAGEABLE BRANCHED POLYMER

(75) Inventors: Hao Xu, Rolla, MO (US);
Ramil-Marcelo L. Mercado, Rolla, MO (US); Douglas J. Guerrero, Rolla, MO (US); Jim D. Meador, Manchester, MO (US)

(73) Assignee: Brewer Science Inc., Rolla, MO (US)

( * ) Notice: Subject to any disclaimer, the term of this patent is extended or adjusted under 35 U.S.C. 154(b) by 773 days.

(21) Appl. No.: 12/261,971

(22) Filed: Oct. 30, 2008

(65) Prior Publication Data
US 2009/0111057 A1    Apr. 30, 2009

Related U.S. Application Data

(60) Provisional application No. 60/983,778, filed on Oct. 30, 2007.

(51) Int. Cl.
*G03F 7/20* (2006.01)
*G03F 7/30* (2006.01)
*G03F 7/38* (2006.01)
*G03C 1/825* (2006.01)
*G03C 1/835* (2006.01)

(52) U.S. Cl. ............... 430/311; 430/271.1; 430/325; 430/326; 430/327; 430/330; 430/272.1; 430/275.1; 430/278.1; 430/950

(58) Field of Classification Search .............. None
See application file for complete search history.

(56) References Cited

U.S. PATENT DOCUMENTS

| | | | |
|---|---|---|---|
| 6,054,254 A | 4/2000 | Sato et al. | |
| 6,110,653 A | 8/2000 | Holmes et al. | |
| 6,399,269 B2 | 6/2002 | Mizutani et al. | |
| 7,070,914 B2 | 7/2006 | Neisser et al. | |
| 2002/0015909 A1* | 2/2002 | Mizutani et al. | 430/270.1 |
| 2003/0129531 A1 | 7/2003 | Oberlander et al. | |
| 2003/0166828 A1 | 9/2003 | Cox et al. | |
| 2004/0018451 A1 | 1/2004 | Choi | |
| 2005/0255410 A1* | 11/2005 | Guerrero et al. | 430/311 |
| 2006/0177772 A1 | 8/2006 | Abdallah et al. | |
| 2006/0177774 A1 | 8/2006 | Abdallah et al. | |
| 2006/0210915 A1 | 9/2006 | Takei et al. | |
| 2007/0117049 A1 | 5/2007 | Guerrero et al. | |
| 2008/0213707 A1 | 9/2008 | Brodsky et al. | |

FOREIGN PATENT DOCUMENTS

| | | |
|---|---|---|
| EP | 0 989 463 | 3/2000 |
| EP | 1 662 769 | 5/2006 |
| EP | 1 845 416 | 10/2007 |
| JP | 2001222112 | 8/2001 |

OTHER PUBLICATIONS

Sakamizu et al., "Acid-breakable Resin-based Resist for Nanofabrication Electron-beam Lithography," 2000, J. Photopolym. Sci. Technol., vol. 13. No. 3, 405-412.
International Search Report and Written Opinion dated Jun. 23, 2009 in corresponding PCT/US2008/081831 filed Oct. 30, 2008.
International Preliminary Report on Patentability dated May 14, 2010 in corresponding PCT/US2008/081831 filed Oct. 30, 2008.
Otsuka et al., "Poly(hemiacetal ester)s: New class of polymers with thermally dissociative units in the main chain," Macromolecules, vol. 32, No. 26, 1999, pp. 9059-9061.
Wang et al., "Deep UV positive photoresists based on acidolytic cleavage of novel ester acetal polymer," ISTC 2007: Proceedings of the 6th International Semiconductor Technology Conference, 2007A, pp. 722-729.
Wang et al., "Two-component resists based on acidolytic cleavage of novel ester acetal polymer," Proceedings of SPIE, vol. 6519, 2007B, pp. 65192I-1-end.
Wang et al., "Studies on a cross-linking type positive 193nm photoresist material," Proceedings of SPIE, vol. 6153, 2006, pp. 615329-1-end.
Wang et al., "Novel 193-nm positive photoresist composed of ester acetal polymer without phenyl group," Proceedings of SPIE, vol. 6519, 2007C, pp. 65192H-1-end.
Willson Research Group, "Aqueous processable positive and negative tone photoresists," University of Texas at Austin, http:willson.cm.utexas.edu/Research/Sub_Files/Water_Soluble/, Apr. 18, 2001.
Zhai et al., "Novel 193-nm positive photoresist materials—ester acetal polymer without phenyl group," ISTC 2007: Proceedings of the 6th International Semiconductor Technology Conference, 2007, pp. 730-737.
Moon et al., "Three-Component Photopolymers Based on Thermal Cross-Linking and Acidolytic De-Cross-Linking of Vinyl Ether Groups. Effects of Binder Polymers on Photopolymer Characteristics," Chem. Mater., 1994, vol. 6, No. 10, 1854-1860.

* cited by examiner

*Primary Examiner* — Sin J. Lee
(74) *Attorney, Agent, or Firm* — Hovey Williams LLP (57) ABSTRACT

Novel, developer-soluble anti-reflective coating compositions and methods of using those compositions are provided. The compositions comprise a multi-functional acid reacted with a multi-functional vinyl ether to form a branched polymer or oligomer. In use, the compositions are applied to a substrate and thermally crosslinked. Upon exposure to light and post-exposure baking, the cured polymers/oligomers will decrosslink and depolymerize, rendering the layer soluble in typical photoresist developing solutions (e.g., alkaline developers).

16 Claims, 4 Drawing Sheets

PHOTOIMAGEABLE BRANCHED POLYMER

RELATED APPLICATIONS

The present invention claims the benefit of U.S. Provisional Application No. 60/983,778, filed Oct. 30, 2007, entitled PHOTOIMAGEABLE BRANCHED POLYMER, incorporated by reference herein.

FIELD OF THE INVENTION

The present invention is concerned with novel, photoimageable branched polymers, developer-soluble, photosensitive anti-reflective coating compositions including those polymers, and methods of using such compositions.

DESCRIPTION OF THE PRIOR ART

As feature sizes shrink to 65 nm and smaller, new and more advanced materials will be needed to achieve the goals set by the semiconductor industry. Photoresists, bottom anti-reflective coatings, and any other layers used in the imaging process must work together to achieve high-resolution lithography targets. For example, resist thickness loss that occurs during the bottom anti-reflective coating and substrate etch steps becomes a critical issue because new resists are much thinner than older-generation materials. While resist thickness is being reduced, bottom anti-reflective coating thickness is not expected to decrease at the same rate, which further complicates the problem of resist loss. A solution to this problem is to eliminate the bottom anti-reflective coating etch step by using a wet-developable or developer-soluble bottom anti-reflective coating or other wet-developable underlayers. Wet-developable layers typically have utilized a polyamic acid soluble in alkaline media as a polymer binder, thus allowing the film to be removed when the resist is developed. These traditional wet-developable materials are rendered insoluble in resist solvents by taking advantage of a thermally driven amic acid-to-imide conversion. This process works well, however, it has two limitations: 1) the bake temperature window can be narrow (less than 10° C.) where the film remains insoluble in organic solvents but soluble in alkaline developer; and 2) the wet-develop process is isotropic, meaning the film is removed vertically at the same rate as horizontally, which leads to undercutting of the resist lines. While this is not a problem with larger geometries (greater than 0.2 micron), it can easily lead to line lifting and line collapse at smaller line sizes.

SUMMARY OF THE INVENTION

The present invention is broadly concerned with a method of forming a microelectronic structure. In the method, a substrate having a surface is provided, and a composition is applied to this surface. The composition includes a compound comprising a branched polymer, branched oligomer, or a mixture thereof, with the compound having a first molecular weight.

The compound in the composition is crosslinked, followed by exposure of the composition to light and baking so as to decrosslink the compound and to break the compound into moieties. At least about 80% of the resulting moieties have respective molecular weights that are less than the compound first molecular weight.

DETAILED DESCRIPTION OF THE PREFERRED EMBODIMENTS

The present invention solves the problem of isotropic development in prior art developer-soluble coatings by using a crosslinking/decrosslinking/depolymerization mechanism that causes the film to become alkaline-soluble only in the exposed areas. In this manner, horizontal development (undercut) is minimized or eliminated. In addition, the presence of small molecules after light exposure instead of macromolecules improves the imaging performance because the small molecules are more easily removed and more readily dissolved compared to macromolecules.

Broadly, the compositions comprise a compound selected from the group consisting of branched polymers, branched oligomers, and mixtures thereof dissolved or dispersed in a solvent system.

Preparation of Branched Polymer or Oligomer

The compound (i.e., the branched or non-linear polymer or oligomer) can be formed by reacting a multi-functional acid with a multi-functional vinyl ether, forming hemiacetal ester or acetal structures. For the multi-functional acid, any acidic group that can react with a vinyl ether would be suitable. More particularly, an acidic group with a pKa of 4-11 would be acceptable. Preferred such acidic groups include those selected from the group consisting of carboxylics, phenolics, sulfonamides, fluorinated alcohols, and mixtures thereof. Examples of suitable fluorinated alcohols include those selected from the group consisting of The acidic groups can be present on an oligomer, polymer, or compound. For example, the acidic groups could be present on substituted and unsubstituted acrylates, methacrylates, novolaks, isocyanurates, glycidyl ethers, and mixtures thereof.

The acid group is preferably present on the multi-functional acid oligomer or compound at a level of at least about 23% by weight, more preferably from about 29% to about 79% by weight, and even more preferably from about 39% to about 78% by weight, based upon the total weight of the multi-functional acid oligomer or compound taken as 100% by weight.

Preferred multi-functional vinyl ethers are di-, tri-, and/or tetra-functional and have the formula where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of: alkyls (preferably $C_1$-$C_{18}$ and more preferably $C_1$-$C_{10}$); alkoxys (preferably $C_1$-$C_{18}$, and more preferably $C_1$-$C_{10}$); carbonyls; and combinations of two or more of the foregoing, and n is 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of The multi-functional acid and multi-functional vinyl ether are preferably reacted in the presence of an acid catalyst. Preferred acid catalysts are selected from the group consisting of pyridinium p-toluenesulfonate ("PPTS"), pyridinium sulfosalicylic acid, p-toluenesulfonic acid ("pTSA"), and other thermal acid generators (TAGs). The acid catalyst is preferably utilized at levels of from about 0.15% to about 0.60% by weight, and more preferably from about 0.19% to about 0.40% by weight, based upon the total weight of reaction solution taken as 100% by weight.

The multi-functional acid ("MFA") and multi-functional vinyl ether ("MFVE") are preferably reacted at an equivalents ratio of MFA:MFVE of from about 1:1.3 to about 1:0.7, and more preferably from about 1:1.1 to about 1:0.9. Furthermore, this reaction is preferably carried out in a solvent system including solvents such as those selected from the group consisting of propylene glycol methyl ether acetate ("PGMEA"), propylene glycol methyl ether ("PGME"), propylene glycol n-propyl ether ("PnP"), ethyl lactate, propylene glycol n-butyl ether ("PnB"), cyclohexanol, tetrahydrofuran ("THF"), ether, dichloromethane, chloroform, γ-butyrolactone, and mixtures thereof. Preferably, the solvent system has a boiling point of from about 50° C. to about 250° C., and more preferably from about 100° C. to about 175° C. The solvent system should be utilized at a level of from about 65% to about 99% by weight, and preferably from about 69% to about 98% by weight, based upon the total weight of the reaction formulation taken as 100% by weight. This reaction is preferably carried out for a time period of from about 14 hours to about 36 hours, preferably at ambient temperatures and preferably while stirring.

At the end of the reaction time, a quencher is preferably added in order to neutralize any remaining acid, as well as any acid that might have been thermally generated during the reaction. When utilized, the quencher would typically be added at levels of from about 0.75% to about 1.30% by weight, and more preferably from about 0.80% to about 0.85% by weight, based upon the total weight of reaction solution taken as 100% by weight. Suitable quenchers include those selected from the group consisting of triethanolamine ("TEA"), pyridine, and mixtures thereof.

During the preparation process, a number of the acid groups will react with vinyl ether groups to form an initial number of hemiacetal or acetal linkages having the formula where R is selected from the group consisting of aryls (preferably from about $C_6$ to about $C_{14}$), alkyls (preferably from about $C_1$ to about $C_8$), aryl alkyls (preferably from about $C_6$ to about $C_{12}$, and from about $C_1$ to about $C_8$, respectively), alkenes (preferably from about $C_1$ to about $C_8$), cyclics (preferably from about $C_5$ to about $C_{10}$), —CO—, —SO—, —S—, —CONH—, glycol, and adamantyl.

Particularly preferred R groups are selected from the group consisting of

However, not all acid groups will react with vinyl groups. Acid groups that have not reacted with the multi-functional vinyl ether are preferably present in the branched compound at a level of at least about 2% by weight, preferably from about 4% to about 60% by weight, and even more preferably from about 20% to about 55% by weight, based upon the total weight of the compound taken as 100% by weight. Furthermore, vinyl groups that have not reacted with acid groups will be present at a level of at least about 2% by weight, preferably from about 4% to about 60% by weight, and more preferably from about 20% to about 55% by weight, based upon the total weight of the compound taken as 100% by weight.

In one embodiment, the branched polymer or oligomer can be represented by the formula where:
each $R_3$ is individually selected from the group consisting of alkyls (preferably $C_1$-$C_8$), aryls (preferably from about $C_6$ to about $C_{14}$), and functional derivatives thereof;
Y is selected from the group consisting of each x, y, and z is individually selected from the group consisting of 0 and 1; and
at least one of x, y, and z is 1.

Unlike prior art compositions, the unreacted acid groups are preferably not protected by a protective group. That is, at least about 95%, preferably at least about 98%, and more preferably about 100% of the acid groups that have not reacted with the multi-functional vinyl ether are also free of protective groups. A protective group is a group that prevents the acid from being reactive.

Preparation of Coating Composition Including Branched Polymer and/or Oligomer

The above-described mother liquor can be used to prepare the coating composition. Alternatively, a polymer meeting the above specifications can be purchased commercially and used to make the coating formulation.

With either approach, the coating composition will be prepared by mixing additional ingredients with the mother liquor that includes the branched compound. One ingredient that should be included in the coating composition is a catalyst. The preferred catalyst is an acid generator, and particularly a photoacid generator ("PAG," both ionic and/or non-ionic). Any PAG that produces an acid in the presence of light is suitable. Preferred PAGs include onium salts (e.g., triphenyl sulfonium perfluorosulfonates such as triphenyl sulfonium nonaflate and triphenyl sulfonium triflate), oxime-sulfonates (e.g., those sold under the name CGI® by CIBA), and triazines (e.g., TAZ108® available from Midori Kagaku Company).

The coating compositions preferably comprise from about 0.35% to about 10% by weight of catalyst (preferably a PAG), and more preferably from about 1% to about 7% by weight of catalyst, based upon the total weight of the polymer and oligomer solids in the composition taken as 100% by weight.

Although a TAG can be included in the inventive compositions, in a preferred embodiment the composition is essentially free of TAGs. That is, any TAGs are present at very low levels of less than about 0.05% by weight, and preferably about 0% by weight, based upon the total weight of the composition taken as 100% by weight.

It is also preferred that the inventive compositions comprise a chromophore (also referred to as a light attenuating compound or moiety or a dye). The chromophore can be provided as part of the branched compound (either as a functional group on the compound or as part of the polymer backbone or oligomer core), or the chromophore can simply be physically mixed in the composition. The chromophore should be present in the composition at a level of from about 7% to about 75% by weight, and preferably from about 11% to about 65% by weight, based upon the total weight of the polymer and oligomer solids in the composition taken as 100% by weight.

The chromophore is selected based upon the wavelength at which the compositions will be processed. For example, at wavelengths of 193 nm, preferred chromophores include substituted and unsubstituted phenyls (e.g., polyhydroxystyrene), heterocyclic chromophores (e.g., furan rings, thiophene rings), and functional moieties of the foregoing.

At wavelengths of 248 nm, preferred chromophores include naphthalenes (e.g., naphthoic acid methacrylate, 3,7-dihydroxy-2-naphthoic acid), heterocyclic chromophores, carbazoles, anthracenes (e.g., 9-anthracene methyl methacrylate, 9-anthracenecarboxylic acid), and functional moieties of the foregoing. Another preferred dye for use at 248 nm is an adduct of polyglycidyl methacrylate and 3,7-dihydroxy-2-naphthoic acid. Its formation is described in Example 2, and it has the structure where n is from about 4 to about 30.

The present invention also provides a significant advantage over the prior art in that the use of an added crosslinking agent is not required, and is preferably avoided. That is, the coating composition is preferably substantially free of added crosslinking agents. More particularly, the composition comprises less than about 1%, preferably less than about 0.5%, and more preferably about 0% by weight crosslinking agents, based upon the total weight of solids in the composition taken as 100% by weight.

It will be appreciated that a number of other optional ingredients can be included in the compositions as well. Typical optional ingredients include surfactants, amine bases, and adhesion promoters.

Regardless of the embodiment, the coating compositions are formed by simply dispersing or dissolving the compound (i.e., the branched polymers, branched oligomers, or mixtures thereof) in a suitable solvent system, preferably at ambient conditions and for a sufficient amount of time to form a substantially homogeneous dispersion. The other ingredients (e.g., PAG) are preferably dispersed or dissolved in the solvent system along with the compound. Or, as described above, the branched compound could be provided as part of a mother liquor solution, with the additional ingredients being mixed with that solution, and additional solvent being added as necessary to achieve the desired solids content.

With either approach, the branched compound is preferably present in the final coating composition at a level of from about 80% to about 99% by weight, and more preferably from about 90% to about 99% by weight, based upon the total weight of the solids in the composition taken as 100% by weight. The preferred solids content of the final coating composition is from about 0.5% to about 10% by weight, more preferably from about 0.5% to about 6% by weight, and even more preferably from about 1% to about 4% by weight, based upon the total weight of the composition taken as 100% by weight.

Preferred solvent systems include those mentioned above with respect to the mother liquor formulation. Preferably, the solvent system has a boiling point of from about 50-250° C., and more preferably from about 100-175° C. The solvent system should be utilized at a level of from about 90% to about 99.5% by weight, more preferably from about 94% to about 99.5% by weight, and even more preferably from about 96% to about 99% by weight, based upon the total weight of the composition taken as 100% by weight.

Methods of Using the Coating Compositions

The methods of applying the compositions to a substrate (such as a microelectronic substrate) simply comprise applying a quantity of a composition hereof to the substrate surface by any known application method (including spin-coating). The substrate can be any conventional circuit substrate, and suitable substrates can be planar or can include topography (e.g., contact or via holes, trenches). Exemplary substrates include silicon, aluminum, tungsten, tungsten silicide, gallium arsenide, germanium, tantalum, tantalum nitrite, SiGe, low k dielectric layers, dielectric layers (e.g., silicon oxide), and ion implant layers.

After the desired coverage is achieved, the resulting layer should be heated to a temperature of from about 80° C. to about 250° C., and preferably from about 140° C. to about 180° C., to induce crosslinking of the compound in the layer. Crosslinking will form further acetal bonds, with the final number of acetal bonds or linkages being greater (i.e., at least about 1.1 times, and preferably at least about 1.2 times) than the initial number of acetal bonds or linkages in the branched compound prior to crosslinking. That is, the crosslinked polymers or oligomers will comprise linkages having the formula where R is selected from the group consisting of aryls (preferably from about $C_6$ to about $C_{14}$), alkyls (preferably from about $C_1$ to about $C_8$), aryl alkyls (preferably from about $C_6$ to about $C_{12}$, and from about $C_1$ to about $C_8$, respectively), alkenes (preferably from about $C_1$ to about $C_8$), cyclics (preferably from about $C_5$ to about $C_{10}$), —CO—, —SO—, —S—, —CONH—, glycol, and adamantyl.

Particularly preferred R groups are selected from the group consisting of

The crosslinked layer will be sufficiently crosslinked that it will be substantially insoluble in typical photoresist solvents. Thus, when subjected to a stripping test, the inventive coating layers will have a percent stripping of less than about 5%, preferably less than about 1%, and even more preferably about 0%. The stripping test involves first determining the thickness (by taking the average of measurements at five different locations) of a cured layer. This is the average initial film thickness. Next, a solvent (e.g., ethyl lactate) is puddled onto the cured film for about 10 seconds, followed by spin drying at about 2,000-3,500 rpm for about 20-30 seconds to remove the solvent. The thickness is measured again at five different points on the wafer using ellipsometry, and the average of these measurements is determined. This is the average final film thickness.

The amount of stripping is the difference between the initial and final average Film thicknesses. The percent stripping is:

$$\% \text{ stripping} = \left( \frac{\text{amount of stripping}}{\text{initial average film thickness}} \right) \times 100.$$

The crosslinked layers will also have superior light absorbance. The n value of this cured anti-reflective layer or coating will be at least about 1.3, and preferably from about 1.4 to about 2.0, while the k value will be least about 0.01, preferably at least about 0.1, and more preferably from about 0.2 to about 0.8, at the wavelength of use (e.g., 157 nm, 193 mm, 248 nm, 365 nm). The OD of the cured layers will be at least about 4/μm, preferably from about 4 to about 17 μm, and even more preferably from about 9 to about 15 μm, at the wavelength of use (e.g., 157 nm, 193 nm, 248 nm, 365 nm).

After the layers are cured, further steps can be carried out as necessary for the particular manufacturing process. For example, a photoresist can be applied to the cured layer and subsequently patterned by exposure to light of the appropriate wavelength followed by a post-exposure bake (preferably from about 70° C. to about 150° C., more preferably from about 90° C. to about 130° C.) and development of the exposed photoresist. Advantageously, as the photoresist is exposed to light, so is the inventive coating. Upon exposure to light, an acid is generated from the PAG, and this acid "decrosslinks" the compound in the layer. Furthermore, the acid "depolymerizes" the compound as well. That is, the acid catalyzes the breaking of at least one of (and preferably of both) the C—O bonds (designated by "*" below) of the hemi-acetal ester or acetal that was present in the branched compound as well as those that were created during thermal crosslinking.

This reaction is illustrated below:

where $R_1$, and $R_2$, can be the same or different, and include the same variables as described previously for R.

The breaking of these bonds results in the formation of small molecules or moieties that are smaller than the original branched compound. At least about 80%, preferably at least about 90%, more preferably at least about 95%, and even more preferably about 100% of the moieties generated upon light exposure have respective molecular weights that are smaller than the weight average molecular weight of the starting compound. These moieties can be readily removed during the developing step. That is, the cured compositions that have been exposed to light can be substantially (and preferably completely) removed with conventional aqueous developers such as tetramethyl ammonium hydroxide and KOH developers. Some of these developers are commercialized under the names PD523AD (available from JSR Micro), MF-319 (available from Rohm & Haas, Mass.), and NMD3 (available from TOK, Japan) developers. At least about 95%, preferably at least about 99%, and even more preferably 100% of the inventive coatings will be removed within about 120 seconds by a base developer such as tetramethyl ammonium hydroxide and/or KOH developers after light exposure. This high percent solubility in commercially-available developers after light exposure is a significant advantage over the prior art as this shortens the manufacturing process and makes it less costly.

EXAMPLES

The following examples set forth preferred methods in accordance with the invention. It is to be understood, however, that these examples are provided by way of illustration and nothing therein should be taken as a limitation upon the overall scope of the invention.

Example 1

Coating Formulation Made with Branched Polymer which Absorbs Strongly at 193 nm

In this procedure, 210 mg of trimesic acid (obtained from Fluka, Milwaukee, Wis.) were dissolved in 2 ml of propylene glycol monomethyl ether ("PGME," obtained from Harcros, St. Louis, Mo.) in a 20-ml glass vial. Next, 420 mg of a trifunctional vinyl ether (the preparation of which was reported on page 2 of U.S. Patent Application No. 2007/0117049 (the entirety of which is incorporated by reference herein) were added to the solution, together with 5 mg of PPTS (obtained from Aldrich, Milwaukee, Wis.). The reaction mixture was stirred overnight at room temperature, and then 20 mg of TEA (obtained from Aldrich, Milwaukee, Wis.) were added to neutralize any remaining acid content (and acid thermally generated during baking).

Triphenylsulfonium triflate ("TPS-Tf," obtained from Aldrich, Milwaukee, Wis.) was added as a PAG at a level of 5% by weight, based upon the total weight of the composition taken as 100% by weight. The reaction mixture was diluted by PGME to a solids level of 2.5% and filtered through a 0.1-micron endpoint filter. The formulation was spin-coated at 2,000 rpm onto a silicon substrate and then baked at 150° C. for 60 seconds. The optical constants were measured using a variable angle spectroscopic ellipsometer ("VASE," from J.A. Woollam Co., Inc.) and were determined to be: n at 193 nm was 1.379; and k at 193 nm was 0.374.

The film was rinsed with ethyl lactate ("EL," obtained from Harcros, St. Louis, Mo.) to test the film's solvent resistance, aid was immersed in photoresist developer (PD523AD) without light exposure to evaluate the dark loss. The film was then exposed to light from a mercury-xenon lamp, followed by post-exposure baking ("PEB") at 130° C. for 60 seconds and development using PD523AD for 60 seconds. The results are summarized in Table 1 below, and they indicate that this material has good solvent resistance and little dark loss, but it can be removed by an alkaline developer after exposure.

TABLE 1

| Film Properties of Example 1 | | | |
|---|---|---|---|
| | 30-second EL Strip | Exposure, PEB, and Development | Development Without Exposure |
| Initial Thickness (Å) | 736 | 787 | 751 |
| Thickness after Treatment (Å) | 751 | 0 | 839 |
| % change | 0.7% | −100% | 11.7% |

Example 2

Synthesis of PGM/3,7-DNA Dye

To make a homo-polyglycidyl methacrylate (PGM), 37.5 g of glycidyl methacrylate (Aldrich, Milwaukee, Wis.) were dissolved into 161.52 g of cyclohexanone (obtained from Harcros, St. Louis, Mo.) as the solvent in a clean, 500-ml, three-neck round-bottom flask. The mixture was stirred at room temperature for 5 minutes, until a homogeneous solution was produced. A dropping funnel and condenser were attached to the flask, and the whole setup was protected under nitrogen flow. The dropping funnel was filled with a solution containing 69.3 g of cyclohexanone (obtained from Harcros, St. Louis, Mo.) and 3.65 g of dicumyl peroxide (obtained from ACROS Organics, N.V., NJ). The peroxide solution was slowly, that is, over a 1.5-minute period of time, added into the flask under nitrogen flow with the reaction solution initially at 121° C. Once the addition was complete, the reaction mixture was stirred at about 120-126° C. for 24 hours. About 69-70 mg of 4-methoxyphenol (obtained from Aldrich, Milwaukee, Wis.) was added as an inhibitor, with stirring to dissolution. A sample was taken from this mother liquor for gel permeation chromatography (GPC) analysis, which indicated that $M_w$ was 13,850. The mother liquor was used for the next step in the reaction without further purification.

A 500-ml three-neck flask filled with 105 g of cyclohexanone was charged with 100 g of the mother liquor from the above reaction. After the mixture was stirred to be homogeneous, 18.63 g of 3,7-dihydroxy-2-naphthoic acid ("3,7-DNA," obtained from Aldrich, Milwaukee, Wis.) were added in three portions. Next, 520 mg of benzyltriethylammonium chloride (obtained from Alfa Aesar, Ward Hill, Mass.) were added, and the reaction mixture was stirred at 15-124° C. under nitrogen protection for 24 hours. For this reaction, the polymer $M_w$ was 28,700. The PGM/3,7-DNA polymeric dye was obtained by precipitating into 35/65 by weight PGME/deionized water, re-dissolving in PGME, re-precipitating into hexanes, and vacuum-drying at 50° C.

Example 3

Coating Formulations with Branched Polymer Filled with Polymeric Dye Featuring Tunable Optical Constants A branched polymer scaffold was first synthesized following the method described in Example 1. In a 20-ml glass vial, 246 mg of cyclopentane tetracarboxylic acid (obtained from Aldrich, Milwaukee, Wis.) were dissolved in 2 ml of PGME. Then, 560 mg of the trifunctional vinyl ether described in Example 1 were added into the solution, together with 5 mg of PPTS. The reaction mixture was stirred overnight at room temperature, and then 20 mg of TEA were added.

Branched polyhydroxystyrene (obtained from Hydrite Chemical Company, Brookfield, Wis.) was selected as a 193-nm dye to add to the above reaction mixture. The dye was utilized at a level of 30% by weight, based upon the total solids of the reaction mixture. The resultant solution was further diluted with PGME to total solids content of 2.5% by weight, and TPS-Tf was added as a PAG at a level of 5% by weight, based upon the total solids in the formulation taken as 100% by weight. The formulation was spin-coated at 2,000 rpm onto a silicon substrate and then baked at 150° C. for 60 seconds. The optical constants were measured using a VASE and determined to be: n at 193 nm was 1.524; and k at 193 nm was 0.539. Results from EL stripping, dark loss, and exposure/PEB/development testing are summarized in Table 2.

TABLE 2

Film Properties of Polyhydroxystyrene-Filled Branched Polymer

|  | 30-second EL Strip | Exposure, PEB, and Development | Development Without Exposure |
|---|---|---|---|
| Initial Thickness (Å) | 637 | 687 | 643 |
| Thickness after Treatment (Å) | 660 | 0 | 667 |
| % change | 3.6% | −100% | 3.7% |

Figure 1:
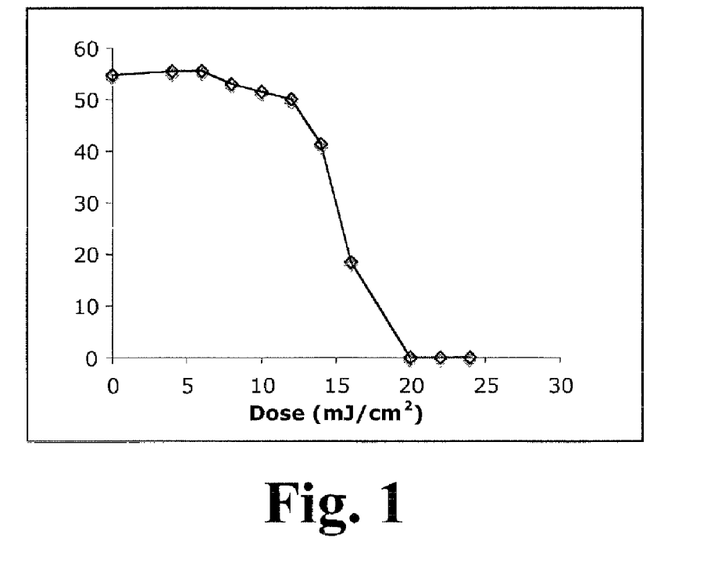
FIG. 1 is a contrast curve of the film formed in Example 3, using the 60% 248-nm dye-filled formulation.

The PGM/3,7-DNA prepared in Example 2 was used as a 248-nm dye to be added into the original branched polymer solution. The dye level varied from 0% to 60% by weight of the total solids content of the formulation, which gave various optical constants. TPS-Tf was added as a PAG at a level of 5% by weight of the total solids content of the formulation. The resultant solution was further diluted by PGME to a total solids content of 2.5% by weight. The formulation was spin-coated at 1,500 rpm onto a silicon substrate and then baked at 150° C. for 60 seconds, followed by EL stripping and dark loss testing. All results are summarized in Table 3. The spin-coated film was exposed to UV light through a 248-nm filter for various periods of time. After a PEB at 130° C. for 60 seconds and development using PD523AD, the remaining thickness (in nanometers) was measured and plotted against the exposure dose (in mJ/cm$^2$). The representative contrast curve (dye %=60%) shown in FIG. 1 clearly indicates the resultant film was soluble in photoresist developer upon UV irradiation at 248 nm.

TABLE 3

Film Properties and Optical Constants of PGM/3,7-DNA-Filled Branched Polymer Formulations

| Dye % | EL Stripping | Dark Loss | n (248 nm) | k (248 nm) |
|---|---|---|---|---|
| 0% | 2.5% | 0% | 1.736 | 0.028 |
| 29% | −0.1% | 0% | 1.742 | 0.199 |
| 50% | −1.2% | −2.8% | 1.762 | 0.340 |
| 60% | −1.0% | −5.7% | 1.771 | 0.389 |

Example 4

Coating Formulation With Branched Polymer which Absorbs at 248 nm and at 193 nm

In this procedure, 204 mg of 3,5-dihydroxy-2-naphthoic acid (obtained from Aldrich, Milwaukee, Wis.) were dissolved in 2 ml of PGME in a 20-ml glass vial. Next, 420 mg of the trifunctional vinyl ether used in Example 1 were added into the solution, together with 5 mg of PPTS. The reaction mixture was stirred overnight at room temperature, and then 20 mg of TEA were added to neutralize any remaining acid content (and any acid thermally generated during baking).

TPS-Tf, in the amount of 100 mg, was added to the formulation as a PAG. The reaction mixture was diluted by adding PGME to achieve a total solids content of 2.5% by weight, followed by filtering through 0.1-micron endpoint filter. The formulation was spin-coated at 1,500 rpm onto a silicon substrate and then baked at 150° C. for 60 seconds. The optical constants were measured using a VASE and were determined to be: n at 193 nm was 1.430; k at 193 nm was 0.246, n at 248 nm was 1.752, and k at 248 nm was 0.275.

Figure 2:
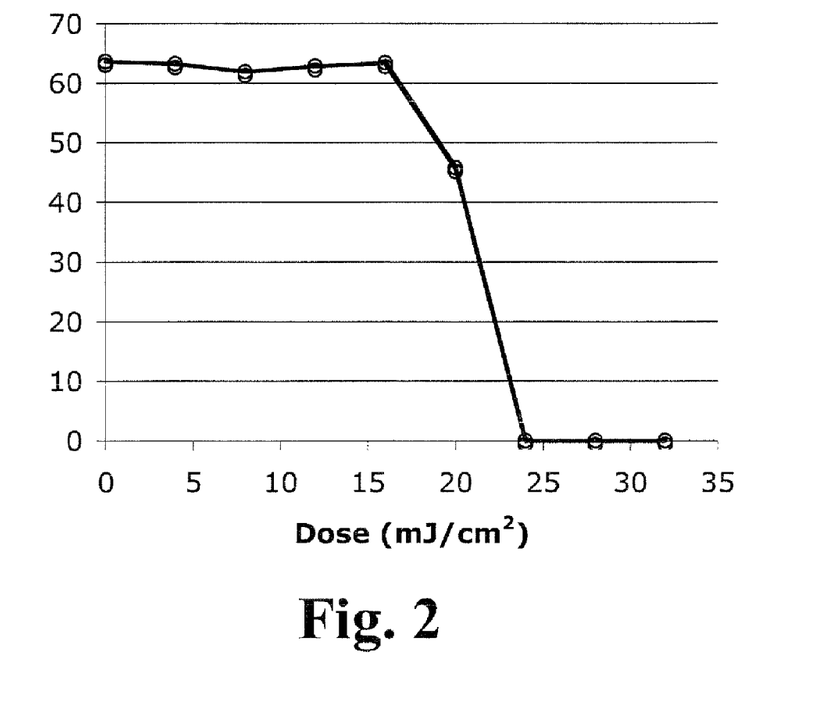
FIG. 2 depicts a contrast curve of the film formed in Example 4.

Results from EL stripping, dark loss, and exposure/PEB/development testing are summarized in Table 4. The spin-coated film was exposed to UV light through a 248-nm filter for various periods of time. After PEB at 130° C. for 60 seconds and development using PD523AD, the remaining thickness (in nanometers) was measured and plotted against the exposure dose (in mJ/cm2), as shown in FIG. 2. The results clearly indicate that the resultant film was soluble in photoresist developer upon UV irradiation at 248 nm with good contrast.

TABLE 4

Film Properties of Example 4

|  | 30-second EL Strip | Exposure, PEB, and Development | Development Without Exposure |
|---|---|---|---|
| Initial Thickness (Å) | 782 | 790 | 742 |
| Thickness after Treatment (Å) | 749 | 0 | 727 |
| % change | −4.2% | −100% | −2.0% |

Example 5

Coating Formulation Transparent at both 248 nm and 193 nm

In this procedure, a 20-ml glass vial was used to dissolve 123 mg of cyclopentane tetracarboxylic acid (obtained from Aldrich, Milwaukee, Wis.) and 172 mg of 1,2-cyclohexane dicarboxylic acid (obtained from TCI, Tokyo, Japan) in 2 ml of PGME before 316 mg of di(ethylene glycol) divinyl ether (obtained from Aldrich, Milwaukee, Wis.) were added, together with 10 mg of PPTS. The reaction mixture was stirred overnight at room temperature, and then 20 mg of TEA were added to neutralize any remaining acid content (and any acid thermally generated during baking).

TPS-Tf was added as a PAG at a level of 5% by weight of the total solids weight. The reaction mixture was diluted by PGME to 2.5% and filtered through 0.1-micron endpoint filter. The formulation was spin-coated at 1.500 rpm onto a silicon substrate and then baked at 160° C. for 60 seconds. The optical constants were measured using a VASE and were determined to be: n at 193 nm was 1.704; k at 193 nm was 0.015; n at 248 was 1.587; and k at 248 was 0.003. Results from EL stripping, dark loss, and exposure/PEB/development testing are summarized in Table 5.

TABLE 5

Film Properties of Example 5

| | 30-second EL Strip | Exposure, PEB, and Development | Development Without Exposure |
|---|---|---|---|
| Initial Thickness (Å) | 405 | 408 | 408 |
| Thickness after Treatment (Å) | 400 | 0 | 407 |
| % change | −1.2% | −100% | −0.2% |

Figure 3:
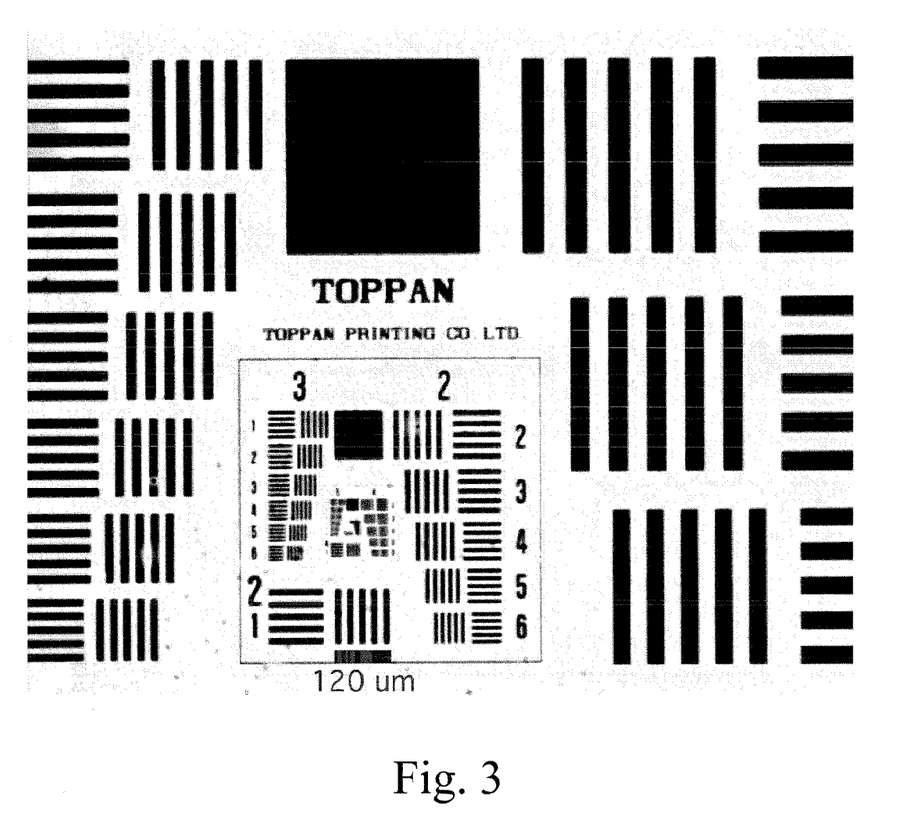
FIG. 3 is a pattern micrograph formed as described in Example 5.

A film made with the coating formulation of this Example was imaged by exposure to a mercury-xenon lamp with a 248-nm filter under a photomask (contact mode), followed by PEB at 130° C. for 60 seconds and rinsing with tetramethylammonium hydroxide (TMAH) developer. The minimum exposure dose required was less than 20 mJ/cm². FIG. 3 shows a micrograph of the patterned film.

Example 6

Reaction Between Tri-Carboxylic Acid and Tri-Vinyl Butyl Ether

In this procedure, 174 mg of aconitic acid (obtained from Aldrich, Milwaukee, Wis.) were dissolved in 2 ml of PGME in a 20-ml glass vial equipped with a stirring bar. Next, 504 mg of the trifunctional vinyl ether described in Example 1 were added, together with 7.5 mg of PPTS. The reaction mixture was stirred overnight at room temperature, and then 30 mg of TEA were added to neutralize any remaining acid content (and any acid thermally generated during baking).

TPS-Tf was added as a PAG at a level of 5% by weight of the total solids content of the formulation. The reaction mixture was diluted by PGME to 2.5% and was filtered through 0.1-micron endpoint filter. The formulation was spin-coated at 2,000 rpm onto a silicon substrate and then baked at 150° C. for 60 seconds. The optical constants were measured using a VASE and were determined to be: n at 193 nm was 1.447; k at 193 nm was 0.246; n at 248 nm was 1.731; and k at 248 nm was 0.024. Results from EL stripping, dark loss, and exposure/PEB/development testing are summarized in Table 6.

TABLE 6

Film Properties of Example 6

| | 30-second EL Strip | Exposure, PEB, and Development | Development Without Exposure |
|---|---|---|---|
| Initial Thickness (Å) | 520 | 555 | 524 |
| Thickness after Treatment (Å) | 502 | 0 | 520 |
| % change | −3.4% | −100% | −0.7% |

Example 7

Reaction Between Di-Carboxylic Acid and Tri-Vinyl Ethyl Ether

In this procedure, 258 mg of 1,2-cyclohexane dicarboxylic acid, 420 mg of the trifunctional vinyl ether prepared in Example 1, and 10 mg of PPTS were dissolved into 27.52 g of PGME in a 60-ml amber plastic bottle to provide 2.5% weight-concentration solids in the formulation. After shaking at room temperature overnight to form a homogeneous solution, TPS-Tf was added at a level of 5% by weight of the total solids content. The formulation was spin-coated at 1,500 rpm onto a silicon substrate and then baked at 150° C. for 60 seconds. The optical constants were measured using a VASE and were determined to be: n at 193 nm was 1.446; and k at 193 nm was 0.276. Results from EL stripping, dark loss, and exposure/PEB/development testing are summarized in Table 7 below, which indicate that this material has good solvent resistance and little dark loss, but it can be removed by alkaline developer after exposure.

TABLE 7

Film Properties of Example 7

| | 30-second EL Strip | Exposure, PEB, and Development | Development Without Exposure |
|---|---|---|---|
| Initial Thickness (Å) | 502 | 488 | 480 |
| Thickness after Treatment (Å) | 502 | 0 | 474 |
| % change | 0% | −100% | −1.3% |

Example 8

In a 20-ml glass vial, 204 mg of 3,7-dihydroxy-2-naphthoic acid (obtained from Aldrich, Milwaukee, Wis.) were dissolved in 2 ml of PGME. Then, 672 mg of the trifunctional vinyl ether described in Example 1 were added into the solution, together with 5 mg of PPTS. The reaction mixture was stirred overnight at room temperature, and then 4.38 mg (0.5 wt % of total solid) of TEA were added to neutralize any remaining acid content (and any acid thermally generated during baking).

Figure 4:
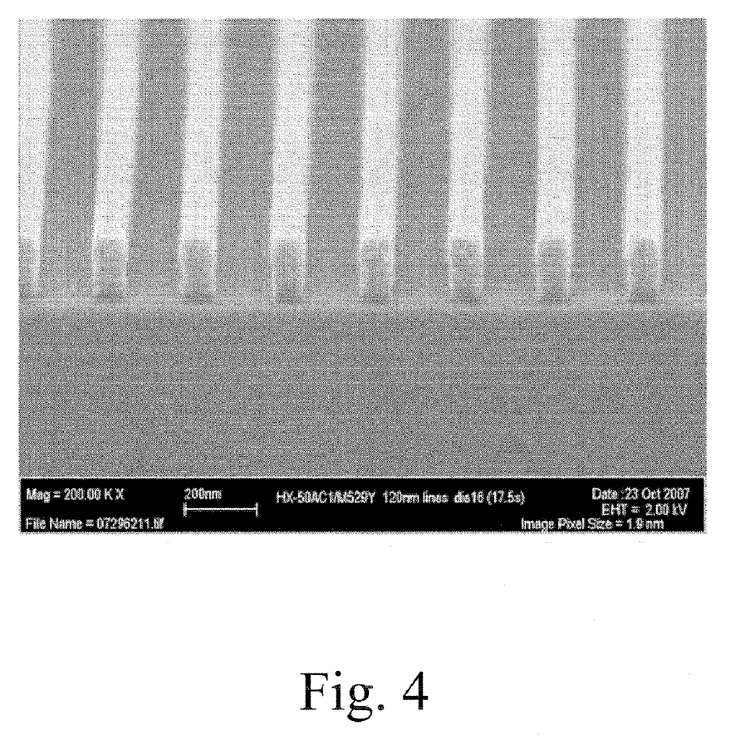
FIG. 4 is a scanning electron microscope (SEM) photograph showing patterns formed by the composition of Example 8.

Without further purification, 26.28 mg (3 wt % of total solid) BBI-109 (obtained from Ciba) was added as PAG, and the reaction mixture was diluted by PGME to 2.5% and filtered through 0.1-micron endpoint filter. The formulation was spin-coated at 1,500 rpm onto a silicon substrate and then baked at 160° C. for 60 seconds. The optical constants were measured using a VASE and were determined to be: n at 248 nm was 1.771; and k at 248 nm was 0.389. Next, M529Y resist (available from JSR Micro) was coated on top at 1,750 rpm and baked at 130° C. for 1 minute. The wafer was then exposed through an in-house interferometer lithographic tool, targeting at 120-nm, dense line patterning. After a PEB at 130° C. for 60 seconds and development using PD523AD, the wafer was cross-section for SEM imaging (see FIG. 4). The bottom anti-reflective coating layer was cleared together with the top photoresist, without obvious footing or undercutting.

Example 9

In this procedure, 210 mg of trimesic acid (from Aldrich) were dissolved in 3 ml of PGME in a 20-ml glass vial. Next, 672 mg of the trifunctional vinyl ether described in Example 1 were added into the solution, together with 10 mg of PPTS. The reaction mixture was stirred overnight at room temperature. Then, 5.6 mg of TEA were added as quencher, 30.0 mg TPS-triflate were added as PAG, and the mixture was diluted by PGME to 2.5% and filtered through 0.1-micron endpoint filter.

Figure 5:
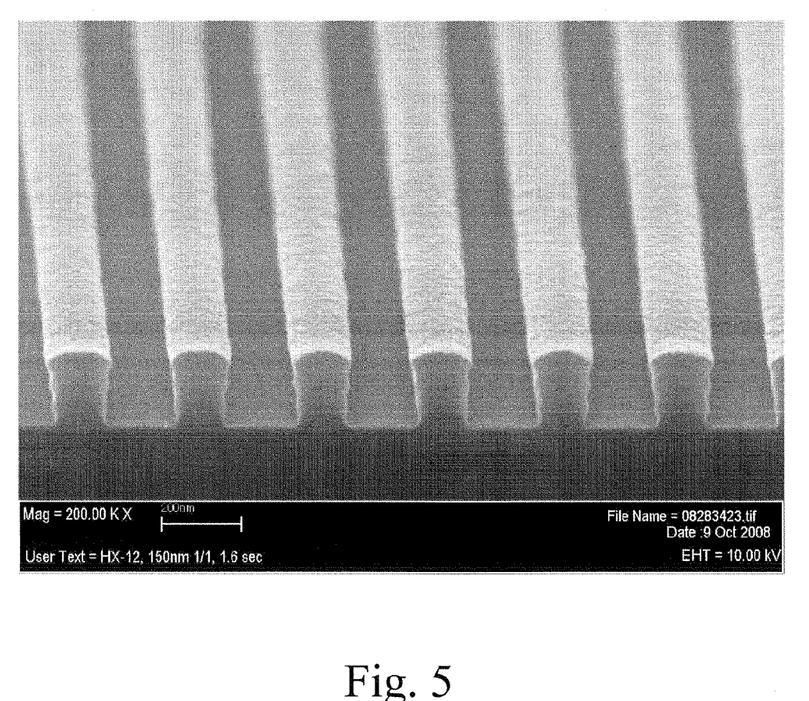
FIG. 5 is an SEM photograph showing patterns formed by the composition of Example 9.

The formulation was spin-coated at 1,500 rpm onto a silicon substrate and then baked at 160° C. for 60 seconds. ARX 3001 resist (obtained from JSR Micro) was coated on top at 1036 rpm and baked at 110° C. for 1 minute. The wafer was then exposed through an in-house interferometer lithographic tool, targeting at 150-nm, dense line patterning. After PEB at 110° C. for 60 seconds and development using PD523AD, the wafer was cross-section for SEM imaging (see FIG. 5). The bottom anti-reflective layer was cleared together with the top photoresist, without obvious footing or undercutting.

We claim:

1. A method of forming a microelectronic structure, said method comprising:
providing a substrate having a surface;
applying a composition to said surface, said composition including a compound comprising a branched polymer, branched oligomer, or a mixture thereof, said compound having a first molecular weight;
crosslinking the compound in said composition;
applying a photoresist layer to said composition; and
exposing said composition to light and baking said composition so as to decrosslink said compound and to break said compound into moieties, at least about 80% of those moieties having respective molecular weights that are less than said first molecular weight.

2. The method of claim 1, further comprising contacting said moieties with a developer so as to remove said moieties from said surface.

3. The method of claim 1, said compound comprising an acid group reacted with a vinyl ether.

4. The method of claim 3, wherein said acid group is selected from the group consisting of carboxylics, phenolics, sulfonamides, fluorinated alcohols, and mixtures thereof.

5. The method of claim 3, said compound comprising an initial number of linkages having the formula where R is selected from the group consisting of alkyls, alkenes, aryls, aryl alkyls, cyclics, —CO—, —SO—, —S—, —CONH—, glycol, and adamantyl.

6. The method of claim 5, wherein R is selected from the group consisting of

7. The method of claim 5, wherein said crosslinking yields crosslinked compounds comprising a final number of linkages having the formula where R is selected from the group consisting of aryls, alkyls, aryl alkyls, alkenes, cyclics, —CO—, —SO—, —S—, —CONH—, glycol, and adamantyl, wherein said final number is greater than said initial number.

8. The method of claim 1, wherein said crosslinking comprises thermally crosslinking said compound.

9. The method of claim 1, wherein said crosslinking yields a layer of composition that is substantially insoluble in photoresist solvents.

10. The method of claim 1, where said exposing and baking yields a layer that is substantially soluble in photoresist developers.

11. The method of claim 1, wherein said exposing and baking results in the breaking of at least one of the bonds (*) of the linkage having the formula where R is selected from the group consisting of aryls, alkyls, aryl alkyls, alkenes, cyclics, —CO—, —SO—, —S—, —CONH—, glycol, and adamantyl.

12. The method of claim 1, wherein said substrate is a microelectronic substrate.

13. The method of claim 12, wherein said substrate is selected from the group consisting of silicon, aluminum, tungsten, tungsten silicide, gallium arsenide, germanium, tantalum, tantalum nitrite, SiGe, ion implant layers, low k dielectric layers, and dielectric layers.

14. The method of claim 12, wherein:

said substrate further comprises structure defining a hole, said structure including sidewalls and a bottom wall; and said applying comprises applying the composition to at least a portion of said hole sidewalls and bottom wall.

15. The method of claim 12, wherein said substrate comprises an ion implant layer, and said applying comprises forming a layer of said composition adjacent said ion implant layer. glycol, and adamantyl.

16. The method of claim 1, wherein said composition is substantially free of crosslinking agents.

* * * * *

UNITED STATES PATENT AND TRADEMARK OFFICE
CERTIFICATE OF CORRECTION

PATENT NO.        : 8,206,893 B2                                        Page 1 of 1
APPLICATION NO.   : 12/261971
DATED             : June 26, 2012
INVENTOR(S)       : Hao Xu et al.

It is certified that error appears in the above-identified patent and that said Letters Patent is hereby corrected as shown below:

In the Claims

Column 24, lines 20-21, the text ending the sentence "adjacent said ion implant layer. glycol, and adamantyl." should read:

-- adjacent said ion implant layer. --

Signed and Sealed this
Eleventh Day of March, 2014

Michelle K. Lee
*Deputy Director of the United States Patent and Trademark Office*